(12) United States Patent
Tredoux

(10) Patent No.: US 8,510,615 B2
(45) Date of Patent: Aug. 13, 2013

(54) VIRTUAL REPAIR OF DIGITAL MEDIA

(75) Inventor: Gavan Leonard Tredoux, Penfield, NY (US)

(73) Assignee: Xerox Corporation, Norwalk, CT (US)

( * ) Notice: Subject to any disclaimer, the term of this patent is extended or adjusted under 35 U.S.C. 154(b) by 813 days.

(21) Appl. No.: 12/603,919

(22) Filed: Oct. 22, 2009

(65) Prior Publication Data

US 2011/0099444 A1    Apr. 28, 2011

(51) Int. Cl.
*G11C 29/00* (2006.01)

(52) U.S. Cl.
USPC .......... 714/723; 714/13; 714/54; 709/203; 709/229; 369/47.14; 386/240; 386/264

(58) Field of Classification Search
USPC .......... 714/13, 54, 723; 709/203, 229; 369/47.14; 386/240, 264
See application file for complete search history.

(56) References Cited

U.S. PATENT DOCUMENTS

| | | | |
|---|---|---|---|
| 5,771,354 A * | 6/1998 | Crawford | 709/229 |
| 6,108,484 A * | 8/2000 | Lim et al. | 386/264 |
| 6,574,420 B1 * | 6/2003 | Ueda et al. | 386/240 |
| 6,615,375 B1 * | 9/2003 | Mounes-Toussi et al. | 714/54 |
| 6,754,860 B2 * | 6/2004 | Kim et al. | 714/723 |
| 2002/0083366 A1 * | 6/2002 | Ohran et al. | 714/13 |
| 2003/0028592 A1 * | 2/2003 | Ooho et al. | 709/203 |
| 2004/0073846 A1 * | 4/2004 | Nakanishi et al. | 714/42 |
| 2004/0126095 A1 * | 7/2004 | Tsumagari et al. | 386/95 |
| 2005/0114333 A1 * | 5/2005 | Nagano et al. | 707/8 |
| 2007/0073878 A1 * | 3/2007 | Issa | 709/225 |
| 2007/0263506 A1 | 11/2007 | Gulas et al. | |
| 2007/0288808 A1 | 12/2007 | Gulas et al. | |
| 2008/0005121 A1 * | 1/2008 | Lam et al. | 707/10 |
| 2010/0067335 A1 * | 3/2010 | Li et al. | 369/47.14 |

FOREIGN PATENT DOCUMENTS

WO    WO2006/019490 A3    2/2006

* cited by examiner

*Primary Examiner* — Joshua P Lottich
*Assistant Examiner* — Jeison C Arcos
(74) *Attorney, Agent, or Firm* — Hoffmann & Baron, LLP

(57) ABSTRACT

Embodiments described herein are directed to a virtual repair of digital media using a virtual repair service. Digital media stored on a digital media device is read using a media player. A request is received by a virtual repair unit from the media player to perform a virtual repair of a segment of unreadable digital content of the digital media. The virtual repair unit retrieves a readable copy of the digital content corresponding to the segment of unreadable digital content identified in the request from a media repository using the virtual repair unit. The virtual repair unit transmits the readable copy of the digital content to the media player for insertion into a buffer of the media player.

16 Claims, 11 Drawing Sheets

VIRTUAL REPAIR OF DIGITAL MEDIA

BACKGROUND

1. Technical Field

The presently disclosed embodiments are directed to virtual repair of digital media.

2. Brief Discussion of Related Art

Digital information, such as audio and/or video information, is commonly distributed on low-cost digital media disks, such as compact disks (CDs), digital versatile disks (DVDs), BluRay disks, and the like. Typically, it is convenient and cost effective to distribute large volumes of digital information on such digital media disks. As a result, digital media disks are commonly used for distributing digital audio and video. Very large numbers of digital media disks have been, and continue to be, distributed and sold throughout the world. The digital information stored on the digital media disks can be played using media players, such as a computing device, a CD player, a DVD player, a high definition DVD (HD DVD) player, a BluRay disk player, and so on. Over time, or even initially, the low-cost media may fail or otherwise be defective so that portions of the digital information stored on the digital media disk are unreadable by the media player. These failures can interfere with use of the digital media disk.

For example, failures with respect to digital information pertaining to audio and/or video may result in skipping, stuttering, halting, or other degradation in quality. The likelihood of such failures can increase with the continued use of the digital media disk, which may lead to an accumulation of defects, such as those caused by scratches, fingerprint marks, dirt, dust, or other corruption associated with wear and tear of the digital media disk. As a result of the defects, a user may no longer be able to enjoy the content of the digital media disk.

Conventional digital media disks may contain mechanisms for a modest degree of error correction, e.g. via error correcting codes or other redundancy built in to the digital media disk. In practice, the amount of damage often exceeds the recovery capabilities of the digital media disks. These errors interfere with use of the digital media disks during audio or video playback, with annoying clicks, freezing and "jumping" caused by repeated re-reading of data and skipping of data that cannot be read. The resulting behavior is extremely undesirable and annoying for users. These errors may occur more frequently when a digital media disk is heavily used, such as in libraries or rental services, although errors can occur even in brand new digital media disks due to small manufacturing defects or media player device limitations, which interact with media properties.

SUMMARY

According to aspects illustrated herein, there is provided a method for virtual repair of digital media stored on a digital media device using a virtual repair service. The method includes receiving, from a media player reading the digital media stored on the digital media device, a request to perform a virtual repair of a segment of unreadable digital content of the digital media using a virtual repair unit. The method also includes retrieving, from a media repository using the virtual repair unit, a readable copy of the digital content corresponding to the segment of unreadable digital content identified in the request. The method also includes transmitting the readable copy of the digital content to the media player for insertion into a buffer of the media player.

According to other aspects illustrated herein, there is provided a system for virtual repair of digital media. The system includes a media repository and a virtual repair unit. The media repository stores a readable copy of the digital media. The virtual repair unit is configured to interface with the media repository. The virtual repair unit receives, from a media player reading the digital media stored on a digital media device, a request to perform a virtual repair of a segment of unreadable digital content of the digital media using a virtual repair unit. The virtual repair unit retrieves, from the media repository, a readable copy of the digital content corresponding to the segment of unreadable digital content identified in the request. The virtual repair unit is further configured to transmit the readable copy of the digital content to the media player for insertion into a buffer of the media player.

According to further aspects illustrated herein, there is provided a computer readable medium that stores instructions executable by a computing system including at least one computing device, wherein execution of the instructions implements a method for virtual repair of digital media. The method implemented upon execution of the instructions includes receiving, from a media player reading the digital media stored on a digital media device, a request to perform a virtual repair of a segment of unreadable digital content of the digital media using a virtual repair unit and retrieving, from a media repository using the virtual repair unit, a readable copy of the digital content corresponding to the segment of unreadable digital content identified in the request. The method implemented upon execution of the instructions also includes transmitting the readable copy of the digital content to the media player for insertion into a buffer of the media player.

DETAILED DESCRIPTION

Figure 1:
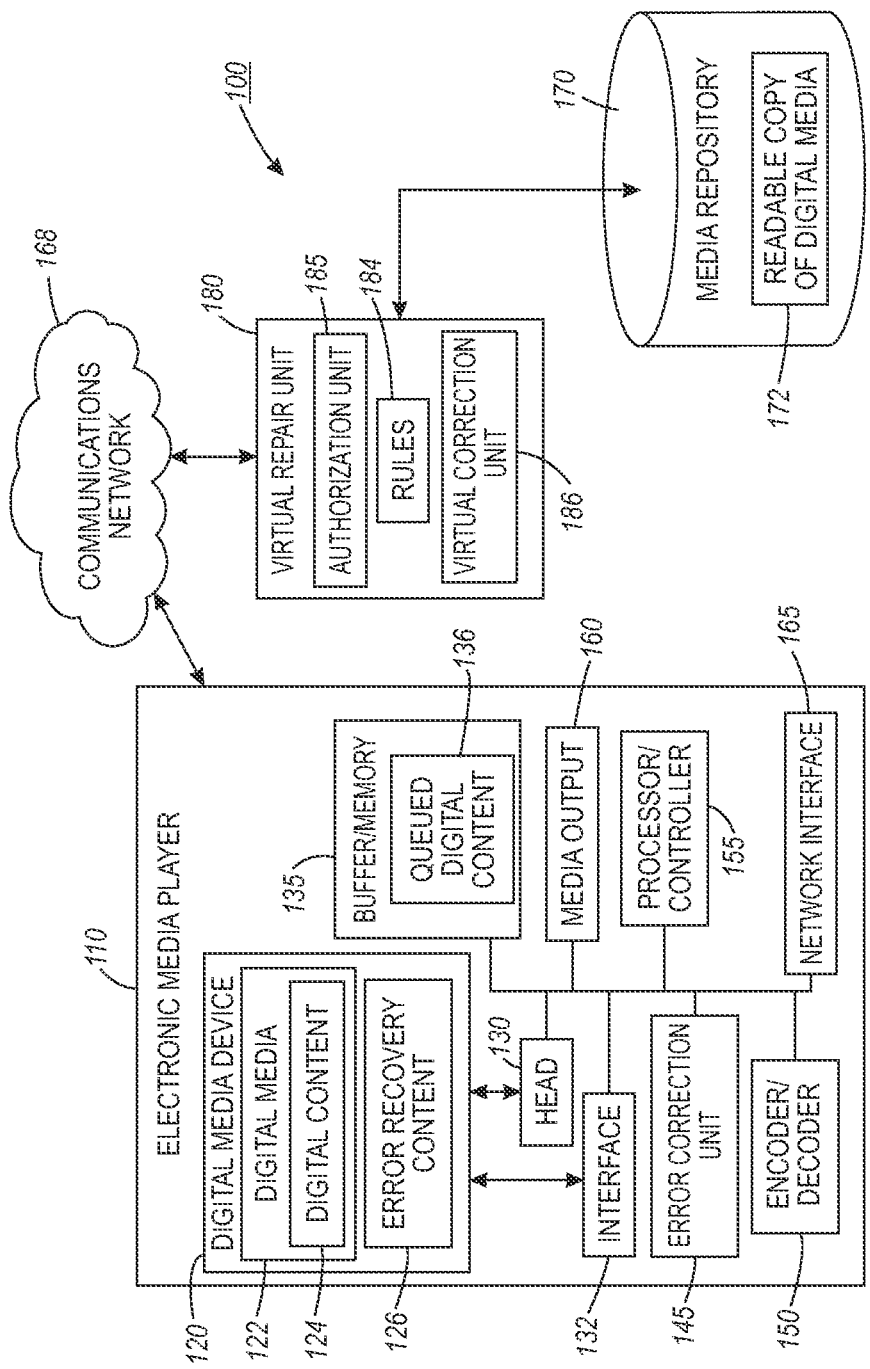
FIG. 1 is a block diagram illustrating an exemplary virtual repair system.

Exemplary embodiments are directed to virtual repair of digital media stored on a digital media device that is being read by a media player. The virtual repair can replace unreadable segments of digital content in a buffer of the digital media player using a remotely stored readable copy of the segments while the digital content is being played by a user. This virtual repair can be accomplished without disturbing the user of the digital media being played by the media player so that the user can seamlessly enjoy listening and/or viewing the digital media encoded and stored on the digital media device.

In exemplary embodiments, a media player that reads and plays the digital media stored on a digital media device can connect to one or more networked media repositories or digital libraries that store a copy of the digital media. The media player can retrieve a readable copy of unreadable portions of the digital media from the media repository using a virtual repair service. By scanning ahead and buffering digital content of the digital media extracted from the digital media device, the virtual repair can be performed without interrupting playback or use of the digital media device. Thus, even for very high volumes of data, such as a high-definition video or image, only a relatively small amount of digital content may be transferred from a media repository to the media player by a virtual repair unit.

Exemplary embodiments can guard against copyright or licensing violation using various schemes. These schemes can prevent an unauthorized user from obtaining digital content through the virtual repair service. These schemes can also prevent and/or discourage coordinated attacks perpetrated by a group of users, where at least one of the users in the group is an authorized user of the virtual repair service and at least one of the users in the group is an unauthorized user of the virtual repair service. For example, exemplary embodiments can require that a user wishing to obtain digital content through the virtual repair service must upload an amount of digital content that is substantially equal to an amount of digital content being requested from the virtual repair service.

In some embodiments, the virtual repair service can be implemented for direct consumers, who own digital media devices, such as CDs, DVDs, HD DVDs, BluRay disks, video games, and computer game disks, on which the digital media is stored. In some embodiments, the virtual repair service can be implemented for rental institutions and libraries where heavy use of the digital media devices can commonly result in portions of the digital media becoming unreadable. In these cases the users or owners can have legitimate copies of the digital media and can benefit from the virtual repair service, which effectively increases the reliability of the digital media, without requiring the creation of more expensive and reliable mass media. The virtual repair service can be implemented to address common situations in which segments of digital media are unreadable. In effect, the virtual repair service provides error correction that is capable of recovering from as much loss of data as the virtual repair service provider wishes to support.

As used herein, a "digital media device" refers to a storage device which stores digital media. Some examples of digital media devices include a compact disk (CD), a digital versatile disk (DVD), high definition DVD (HD DVD), a BluRay disk, a laser disk, a hard drive, video game disks, computer game disks, floppy disk, a solid state storage device, such as a flash memory drive, and so on.

As used herein, "digital media" refers to the cumulative digital information stored on a digital media device, which may be developed for mass distribution. The digital media is stored on the digital media device during a manufacturing process prior to distribution of the digital media device to consumers. Some examples digital media include video, audio, computer animation, and so on, which may be in the form of movies television series or shows, documentaries, video games, computer games, audio tracks including recorded songs, concerts, albums, audio books, other recorded audio/video media, or other digitally stored information.

As used herein, "digital content" refers to sections or portions of digital media stored on a digital media device, which have been extracted from the digital media device by a media player for storage in a buffer of the media player.

As used herein, "unreadable" refers to data that cannot be processed by a media player. Unreadable segments of the digital media typically result from damage to the digital media device, manufacturing errors, incompatibilities, and the like.

As used herein, "readable" refers to data that can be processed by a media player.

As used herein, a "segment" refers to a portion of the digital content of the digital media extracted from the digital media device. A segment can be one or more bits, bytes, words, and the like.

As used herein, a "copy" refers to a replica of the digital media stored apart from the digital media device being read by the media player. For example, a copy of the digital media can be stored in a remote media repository.

As used herein, a "virtual repair unit" refers to a device or application that performs a virtual repair service, where a "virtual repair service" refers to a service that virtually repairs unreadable segments of digital content identified by a media player using a readable copy of the unreadable segment retrieved from a media repository. A "virtual repair" refers to correcting unreadable segments of digital content extracted from a digital media device using a remote copy of the segments of the digital content such that the unreadable digital content of the digital media is not repaired on the digital media device itself or spliced using error recovery content stored on the digital media device.

As used herein, an "authorization unit" refers to a component of the virtual repair unit that determines whether a media player is authorized to make a request for virtual repair and whether the request complies with one or more virtual repair rules. As used herein, "authorized" refers to having permission to use the virtual repair service, a "request" refers to soliciting action, such soliciting the virtual repair unit to perform a virtual repair service, and a "virtual repair rule" refers to a conditional constraint, logical constraint, or other constraint implemented to restrict virtual repair services. For example, the virtual repair rules can be implemented to reduce and/or prevent users of the virtual repair service from engaging in copyright and/or licensing infringement.

As used herein, an "amount" refers to a measure of size or quantity. For example an amount of digital content can refer to a number of bits, bytes, words, and the like, composing the digital content.

As used herein, a "pattern" refers to qualities, acts, tendencies, behaviors, and so on, that form a consistent or characteristic arrangement.

As used herein, a "threshold value" refers to a designated value, which must be exceeded before the virtual repair unit denies a request for virtual repair.

As used herein, a "player identifier" refers to a unique serial number or the like used to identify a particular player making a request. The serial number can be a string of characters specified by the manufacturer when the player is manufactured or can be specified by the virtual repair service when a user registers the player with the virtual repair service.

As used herein, a "media identifier" refers to a title of the digital media, a name of the artist or director, a year in which the digital media was created, a genre of the digital media, an assigned identifier formed from a string of characters, an amount of memory required to store the digital media, a length in time required to complete playback of the entire digital media, and so on, used to identify the digital media for which a readable segment of digital content is being requested.

As used herein, a "segment identifier" refers to an identifier for identifying a position of a segment of digital content with respect to the digital media. For example, a segment identifier can be a time elapsed from the beginning of the digital media, a particular track number on a CD album and a time elapsed from the beginning of the track, a particular chapter and track on a DVD movie and a time elapsed from the beginning of the chapter and/or track, a location on the digital media device from which the digital content of the digital media has been extracted, a byte position of the segment, and so on.

As used herein, a "media player" refers to an electronic device configured to read and play digital content of the digital media stored on a digital media device. Some examples of a media player include a computing device, a CD player, a DVD player, a high definition DVD (HD DVD) player, a BluRay disk player, a laser disk player, a video game console including Xbox and Xbox 360 from the Microsoft Corporation, PlayStation from the Sony, Inc., and Wii from Nintendo, Inc., and so on.

As used herein, a "buffer" refers to a storage component of the media player, which functions as an intermediate to store digital content extracted from the digital media device before the digital content is played by the media player.

As used herein, a "media repository" refers to a storage component remote to the media player and separate from the digital media device, which stores one or more readable copies of digital media for use by the virtual repair unit when performing a virtual repair service.

As used herein, a "signature" refers to distinctive marker that can be included in a virtual repair request, which is used to validate the virtual repair request against one or more virtual repair rules. A signature can be a small amount of data calculated over a larger amount using, for example, cryptographic digest algorithm.

As used herein, "proportional" refers to a comparative relation between things or magnitudes as to size, quantity, number, and the like, and can be expressed as a ratio, such as a one-to-one ratio.

FIG. 1 is a block diagram illustrating an exemplary virtual repair system 100 (hereinafter "system 100") that includes an electronic media player 110 (hereinafter "player 110"), a media repository 170, and a virtual repair unit 180. The player 110 can read a digital media device 120 and play digital media 122 stored on the digital media device 120. The player 110 can include a read/write head 130 (hereinafter "head 130") and/or a hardware and software interface 132 (hereinafter "interface 132"), a buffer/memory 135 (hereinafter "buffer 135"), an error detection/correction unit 145 (hereinafter "correction unit 145"), an encoder/decoder 150, one or more processors/controllers 155 (hereinafter "processor 155"), a media output 160, and a network interface 165.

The player 110 can be communicatively coupled to the digital media device 120. The digital media device 120 can include digital media 122 formed from digital content 124 that can be played using the player 110 and can also include error recovery content 126 to provide for limited error recovery. The digital media device 120 can include a digital media disk, such as a CD, CD-ROM, DVD, BluRay disk, laser disk, hard drive, video game disk, computer game disk, or other digital media disk format and/or can include other digital media devices, such as solid state storage devices including, for example, flash memory drives. The digital media can include video, audio, computer animation, and so on, and can be, for example, in the form of movies, television series or shows, documentaries, video games, computer games, audio tracks including recorded songs, concerts, albums, audio books, other recorded audio/video media, or other digitally stored information.

For embodiments implemented using a digital media disk as the digital media device 120, one or more surfaces of the digital media device 120 can be embedded and encoded with the digital media 122. The digital media 122 can be, for example, audio and/or video content encoded in a digital format. The digital media 122 can be embedded and encoded on the digital media disk as a series of pitted and non-pitted areas, where the pitted and non-pitted areas represent binary coded values.

The head 130 is configured to read the digital media 122 from the digital media disk so that the digital media 122 stored on the digital media disk can be presented to the user. In some embodiments, the head 130 can add digital content to the digital media disk, which is referred to herein as "writing" or "burning". The head 130 can be, for example, an optical reader that scans a surface of the digital media disk to extract a stream of binary encoded data content 124 of the digital media from the pitted and non-pitted areas, which can be decoded by the encoder/decoder 150 of the player 110 to produce audio and/or video of the digital media 122 stored on the digital media disk 120. For embodiments implemented using solid state storage devices as the digital media device, the media player 110 can include the interface 132 for interfacing and reading encoded digital media 122 stored in the solid state device via, for example, a USB port.

As the player 110 extracts the digital content 122 of the digital media, represented as binary encoded data, from the digital media device 120 using the head 130 or software interface 132, the player 110 stores the digital content 124 in the buffer 135. The player 110 can continuously read and store the digital content 124 in the buffer 135 so that a continuous stream of digital content 124 is entering the buffer 135 forming queued digital content 136. The queued digital content 136 stored in the buffer 135 can be removed from the buffer by the encoder/decoder 150 to convert the binary coded values representing the digital content 124 into a form that can be output from the player 110 via the media output 160. The buffer 135 can be implemented as a first-in first-out (FIFO) buffer and the player 110 can remove queued digital content 136 from the buffer 135 as the head 130 or the interface 132 adds more digital content 124 to the buffer 135 so that a continuous flow or stream of queued digital content 136 is created through the buffer 135 to facilitate playback of the digital media 122. The size of the buffer 135 (i.e. the amount of memory for storing the digital content in the buffer) is configured to accommodate the virtual repair service provided by the virtual repair unit 180 so that virtual repair service can repair the digital content to maintain a continuous stream of digital content to facilitate seamless playback of the digital media without disrupting the user's experience.

The correction unit 145 can perform error detection and error correction on the digital content 124 of the digital media 122 as the digital content 124 is read from the digital media device 120 and stored in the buffer 135 as queued digital content 136. The correction unit 145 can use error detection and correction techniques know to those skilled in the art. For example, the correction unit 145 can use error correcting codes or other redundancy that is built in to the digital media device 120 as the error recovery content 126. However, the extent of damage to the digital media 122 stored on the digital media device can often exceed the recovery capabilities of the correction unit 145. Also, since the error correcting codes and redundant digital content is stored on the digital media device 120, the error correcting codes and the redundant digital content can be damaged as well.

The errors created by the unreadable digital content of the digital media 122 can interfere with use of the digital media device 120, for example, resulting in annoying clicks, freezing, "jumping" caused by repeated re-reading of digital content, and skipping of digital content that cannot be read. When the internal correction unit 145 of the player 110 is unable to correct, or the player 110 does not use the internal correction, the unreadable digital content is identified by the player 110 and the player 110 connects to the virtual repair unit 180 via a communication network 168 using the network interface 165.

The media repository 170 can store instances of a readable copy 172 of the digital media 122 that can be used by the virtual repair unit 180 for performing the virtual repair service. For example, the media repository 170 can store readable copies 172 of entire audio and/or video media, such as movies, televisions series or shows, documentaries, video games, computer games, audio tracks including recorded songs, concerts, albums, audio books, other recorded audio/video media, or other digitally stored information. The readable copies 172 of digital media can be indexed in the media repository 170 based on one or more media identifiers, such as, for example, a title of the digital media, a name of the artist or director, a year in which the digital media was created, a genre of the digital media, an assigned identifier formed from a string of characters, an amount of memory required to store the digital media, a length in time required to complete playback of the entire digital media, and so on. The digital content of each readable copy 172 of digital media can be indexed into segments identifying a position of the digital content with respect to the entire digital media so that specific segments of the digital content can be retrieved without requiring the entire readable copy of the digital media to be retrieved.

The virtual repair unit 180 can provide a virtual repair service for the player 110 so that unreadable segments of digital content 124 of the digital media 122 identified by the player 110, which may not be correctable by the player 110, is virtually repaired by the virtual repair unit 180. The virtual repair unit can repair unreadable segments of digital content up to a configurable tolerance as specified by a threshold value. The virtual repair unit 180 includes an authorization unit 182 and a virtual correction unit 186. The authorization unit 182 determines whether the player 110 is authorized to use the virtual repair service provided by the virtual repair unit 180 and also determines whether the repair request received from the player 110 is a valid request. To determine whether the player 110 is authorized to use the virtual repair service, the virtual repair unit 180 can identify the player 110 based on a player ID received with the repair request and/or other identifying features associated with the particular player 110 making the request.

To determine whether the repair request is valid, the authorization unit 182 uses virtual repair rules 184 (hereinafter "rules 184"). In some embodiments, the authorization unit 182 uses the rules 184 to prevent or substantially reduce copyright or licensing infringement by ensuring that virtual repair requests comply with the rules 184. For example, the rules 184 can be implemented to ensure that it is only possible to recover from occasional errors and not to simply read the entire readable copy of the digital media from the repository. In some embodiments, the rules 184 can specify a number of requests allowed within a given time period, a limit to the size of the segments that can be repaired using the virtual repair service, patterns that when detected indicate invalid requests, and so on. In some embodiments, the rules 184 can require that the player include a signature in the repair request to prove that the player has a legitimate copy of the digital media. The signature can be calculated using a segment of the digital content that is readable by the player. In some embodiments, the virtual repair request can require an exchange of data where the virtual repair request must include amount of digital content from the digital media being read by the player that is proportional to the amount of digital content being requested. For example, the virtual repair unit can require a one-to-one ratio between the size of the digital content being requested and the size of digital content that must be uploaded to the virtual repair unit such that if a player requests an amount of digital content, the virtual repair request must include a substantially equal amount of the digital content.

Once the authorization unit 182 authorizes use of the virtual repair service, the virtual correction unit 186 can use the media identifier and segment identifier included in the request to interface with the media repository 170 to locate and retrieve a readable copy of the requested digital content segment. The virtual correction unit 186 can transmit the retrieved readable copy of the requested digital content segment to the player 110 over the network in response to the request. The response to the request can also include the media identifier and segment identifier from the request so that the player 110 can determine where in the buffer to insert the readable copy of digital content segment.

Although video and audio data are some examples of possible uses of the virtual repair unit, those skilled in the art will recognize that the virtual repair unit can be applied to any data where it is desirable, useful, or common to distribute such data on mass storage media devices.

Figure 2:
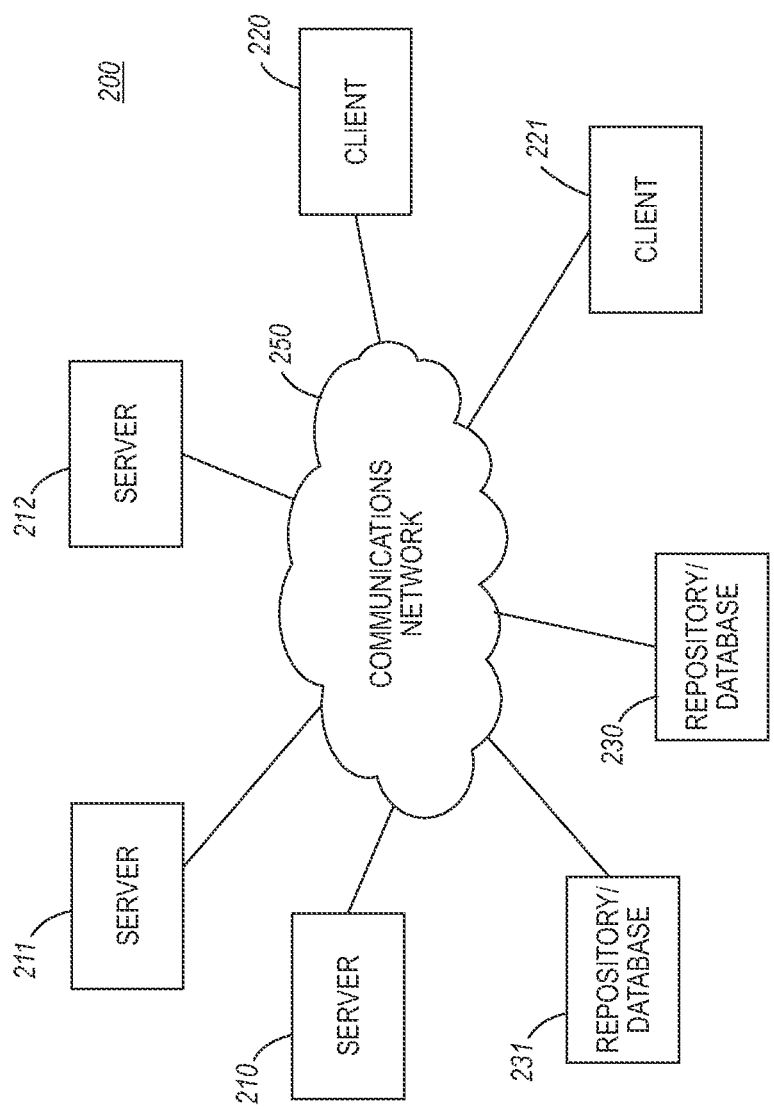
FIG. 2 is an exemplary computing system configured to implement embodiments of the virtual repair system.

FIG. 2 is an exemplary computing system 200 configured to implement embodiments of the system 100. The computing system 200 includes one or more servers 210-212 coupled to clients 220-221, via a communication network 250, which can be any network over which information can be transmitted between devices communicatively coupled to the network. For example, the communication network can be the Internet, intranet, Virtual Private Network (VPN), Local Area Network (LAN), Wide Area Network (WAN), and the like. The computing system 200 can include repositories or database devices 230-231 (hereinafter "repository devices 230-231"), which can be coupled to the servers 210-212, as well as to clients 220-221, via the communications network 250. The servers 210-212 and repository devices 230-231 can be implemented using computing devices. The client devices 220-221 can be instances of the player 110, which, in some embodiments, can be implemented as a computing device.

The servers 210-212, clients 220-221, and/or repository devices 230-231 can store information, such as digital content, error correction codes, authorization codes, and the like. In some embodiments, the virtual repair unit 180 can be implemented using one more of the servers 210-212, the clients 220-221 can each be implemented as instances of the player 110, and/or the media repository 170 can be implemented using one or more of the repository devices 230-231.

Figure 3:
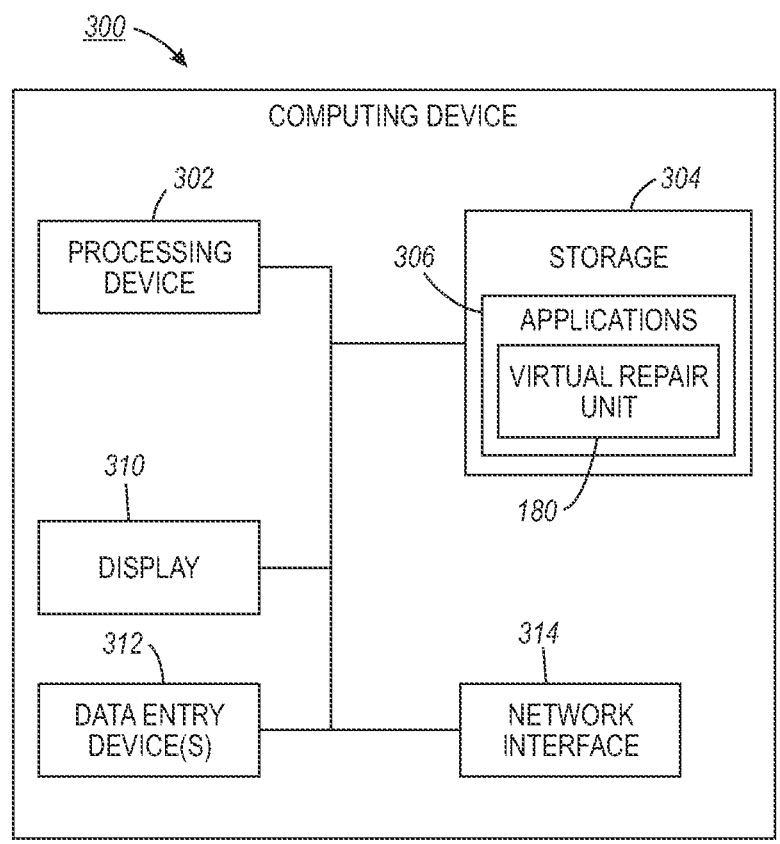
FIG. 3 is a block diagram of an exemplary computing device configured to implement components of the virtual repair system.

FIG. 3 is a block diagram of an exemplary computing device 300 configured to implement embodiments of the virtual repair unit 180. The computing device 300 can be a mainframe, personal computer (PC), laptop computer, workstation, handheld device, such as a portable digital assistant (PDA), and the like. In the illustrated embodiment, the computing device 300 includes one or more processing unit 302, such as a central processing units (CPUs) and/or graphical processing units (GPUs), and can include storage 304. In some embodiments, the computing device 300 can further include or be communicatively coupled to a display device 310 and data entry device(s) 312, such as a keyboard, touch screen, and/or mouse.

The storage 304 stores data and instructions and can be implemented using computer readable medium technologies, such as a floppy drive, hard drive, tape drive, Flash drive, optical drive, read only memory (ROM), random access memory (RAM), and the like. Applications 306, such as the virtual repair unit 180, or portions thereof, can be resident in the storage 304. The instructions can include instructions for implementing embodiments of the virtual repair unit 180. The storage 304 can be local or remote to the computing device 300. The computing device 300 includes a network interface 314 for communicating with a network, such as the communication network 250 of FIG. 2.

The one or more processing units 302 operate to run the applications 306, such as the virtual repair unit 180, in storage 304 by executing instructions therein and storing data resulting from the executed instructions, which may be used for virtual repair of digital content as requested by player 110.

Figure 4:
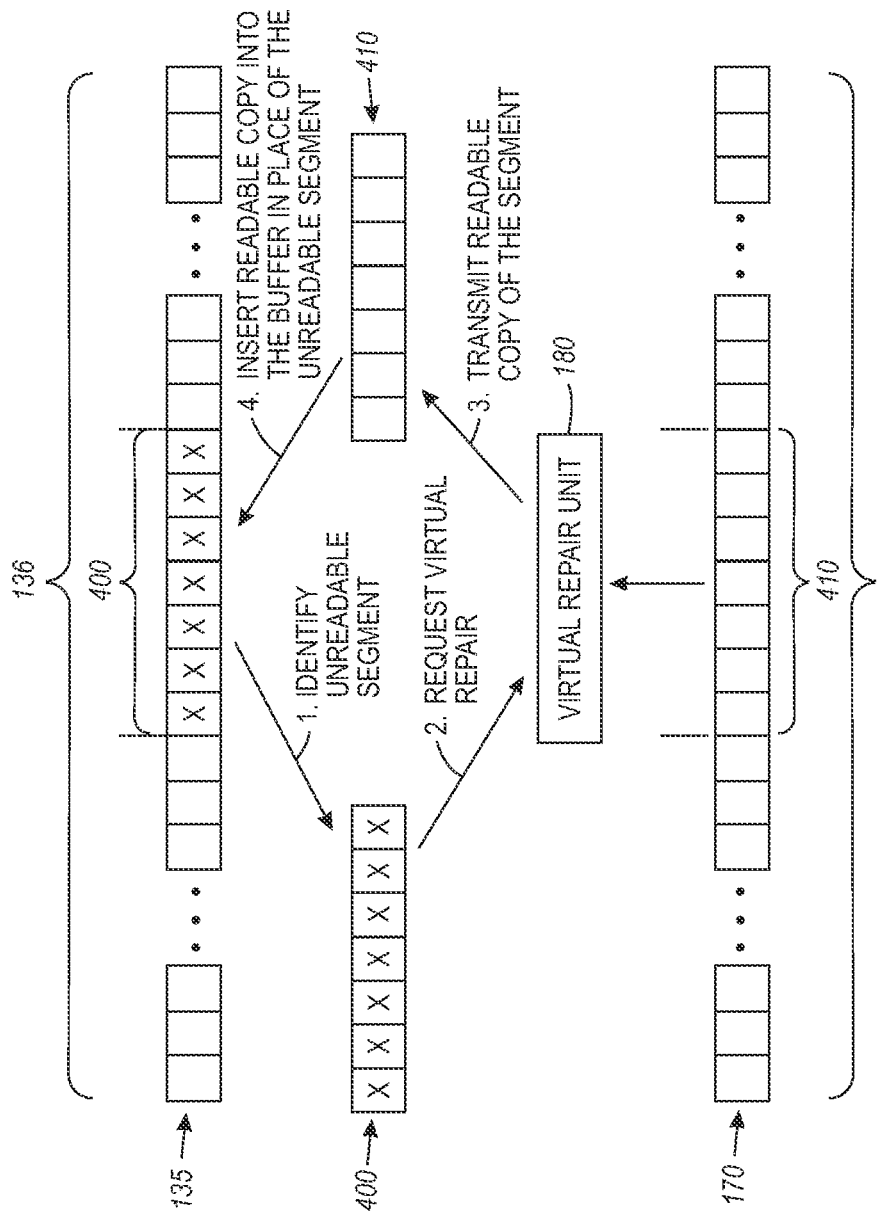
FIG. 4 is a block diagram illustrating a virtual repair of a digital content segment in a buffer of an electronic media player.

FIG. 4 is a block diagram illustrating a virtual repair of an unreadable digital content segment 400 in the buffer 135 of the player 110. The player 110 identifies the unreadable segment 400 in the buffer 135 as well as its current location in the buffer 135. The player also identifies where in the digital content the unreadable segment occurs with respect to the entire digital media so that the player 110 can associate a segment identifier with the unreadable segment 400. While the virtual repair is being performed, the player 110 tracks the location of the unreadable segment in the buffer so that the player knows where to insert the readable copy when it is received from the virtual repair unit. The player 110 makes a request to the virtual repair unit 180, which includes a media identifier and the segment identifier. The virtual repair unit 180 retrieves a readable copy 410 for the unreadable segment 400 from a readable copy of the digital media stored in the media repository 170 and transmits the readable copy 410 to the player 110. The player 110 inserts the readable copy 410 in place of the unreadable segment 400 in the buffer 135.

Figure 5:
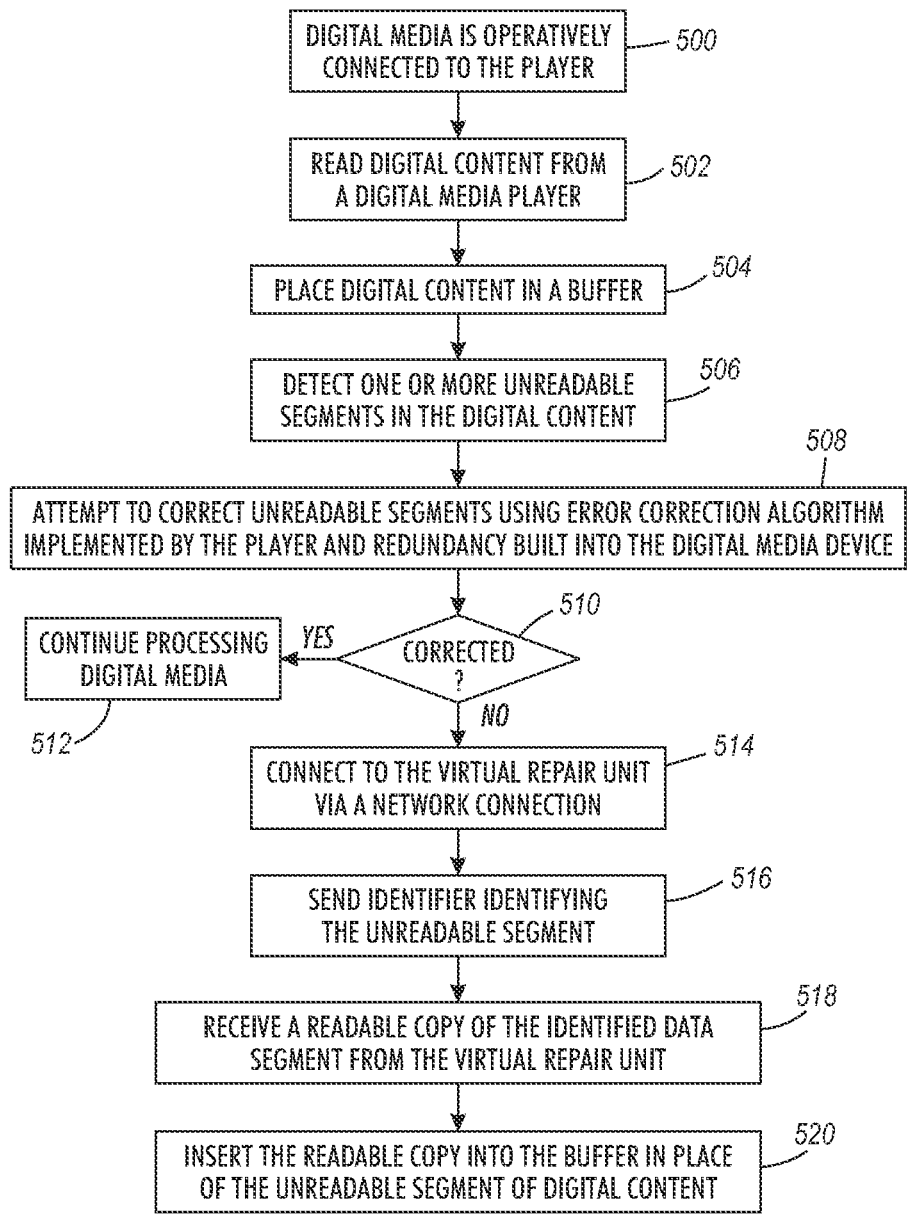
FIG. 5 is flowchart illustrating an exemplary implementation of an electronic media player configured to implement virtual repair of digital media.

FIG. 5 is a flowchart illustrating an exemplary operation of an electronic media player implementing a virtual repair of unreadable digital content. Digital media, such as a digital media disk, is placed in the player or is otherwise operatively connected to the player (500). The player reads the digital media and begins extracting digital content from the digital media (502). The player extracts the digital content as a stream of binary coded values, which are then stored in a buffer (504). The player examines the digital content being read from the digital media to detect any unreadable digital content segments that are being stored in the buffer using the error detection/correction circuitry of the player (506). Once the player identifies unreadable digital content segments, the player attempts to correct unreadable segments using the error detection/correction circuitry and any redundancy built into the digital media device (508). If the player can correct the unreadable digital content segments (510), the player corrects the identified digital content segments so that the unreadable digital content segments stored in the buffer become readable and continues processing the digital content from the digital media (512).

If, however, the player is unable to correct the unreadable digital content segments (510), the player connects to the virtual repair unit via a network connection to initiate a virtual repair of the digital content segments (514). Once the network connection is established, the player sends a request to the virtual repair unit identifying one or more of the unreadable digital content segments for which virtual repair is desired (516). The request can include a player identifier, a media identifier, and a segment identifier. Before the virtual repair unit performs the virtual repair, the virtual repair unit can determine whether the player is authorized to use the virtual repair unit based on the player identifier and that the requested virtual repair does not violate the virtual repair rules based on, at least in part, the player identifier, the media identifier, segment identifier, and/or the digital content included in the request to be uploaded to the virtual repair unit. Once the virtual repair unit determines that the player is authorized to use the virtual repair service, the virtual repair unit processes the request for virtual repair based on the identifiers received with the request and sends a readable copy of the one or more segments to the player.

The player receives the readable copy of the one or more digital content segments from the virtual repair unit (518) and inserts the readable copy of the digital content segments into the buffer in place of the unreadable digital content segments (520). The player processes the previously unreadable digital content and continues process the digital content being read from the digital media.

Figure 6:
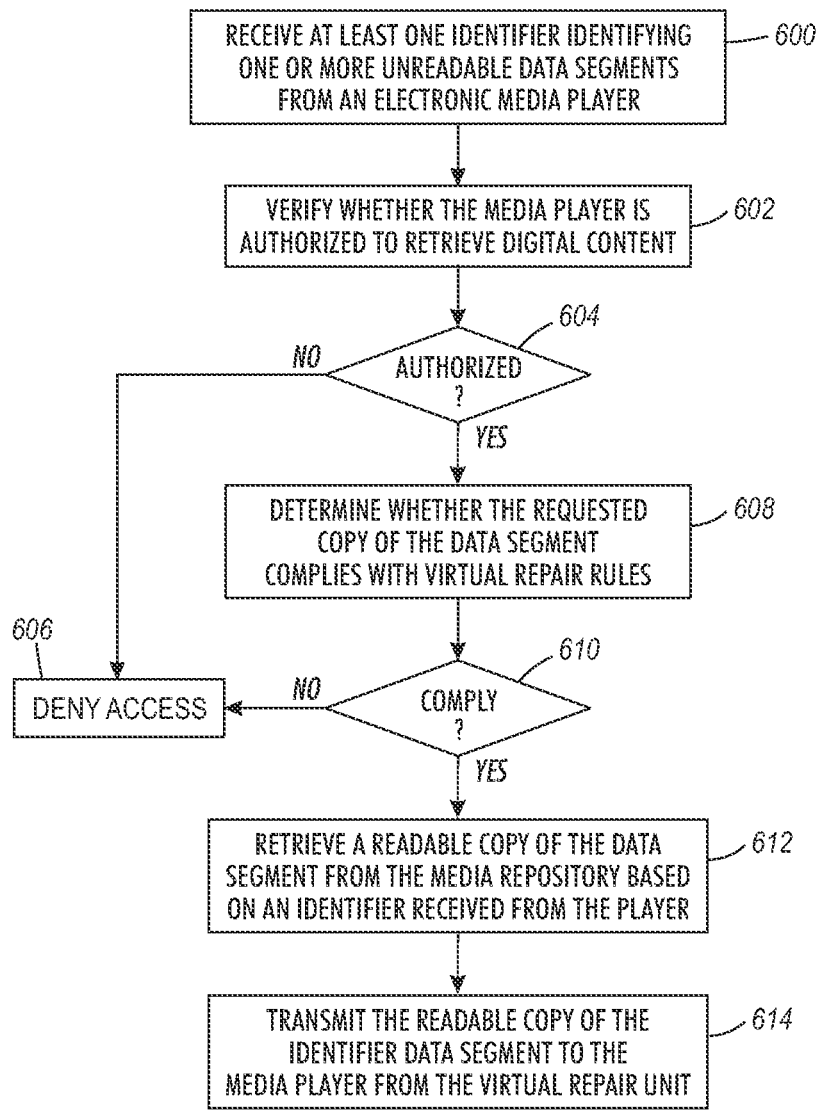
FIG. 6 is flowchart illustrating an implementation of a virtual repair unit.

FIG. 6 is a flowchart illustrating an exemplary operation of the virtual repair unit upon receipt of a request for virtual repair. The virtual repair unit can receive the request for virtual repair from the player, which includes the player identifier, media identifier, and segment identifier identifying one or more unreadable segments of the digital content for which virtual repair is desired (600). The virtual repair unit verifies whether the player is authorized to use the virtual repair service provided by the virtual repair unit (602). The authorization can be based on an identity of the player, for example, using the player identifier, which can be a unique serial number that can be sent to the virtual repair unit with the request for virtual repair. If the player is not authorized to use the virtual repair service (604), the virtual repair unit denies the player access to the service (606).

If the virtual repair unit determines that the player is authorized to use the virtual repair service (604), the virtual repair unit determines whether the virtual repair request complies with virtual repair rules implemented by the virtual repair unit (608). If the virtual repair request does not comply (610), the virtual repair unit denies the player access to the virtual repair service (606). If the virtual repair request complies with the virtual repair rules (610), the virtual repair unit retrieves a readable copy of the requested segment of the digital content from the media repository based on the media identifier and segment identifier received from the player (612). The retrieved readable copy of the requested segment of digital content is transmitted to the player by the virtual repair unit via the network (614).

Figure 7:
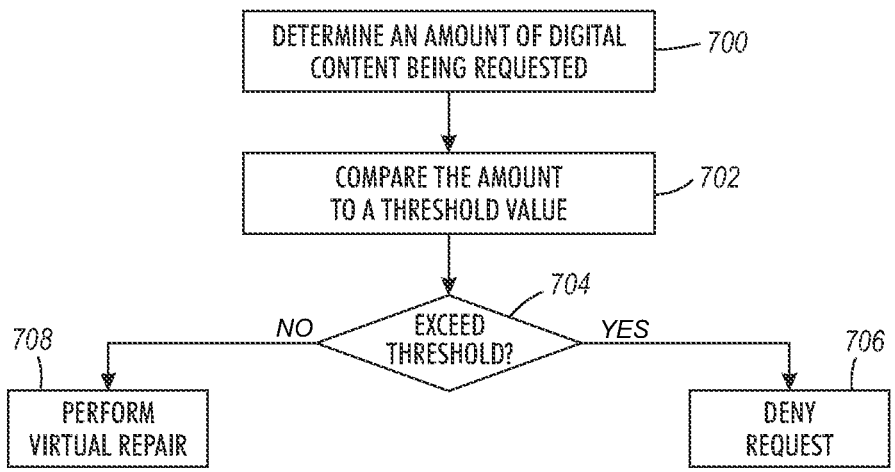
FIG. 7-12 are flowcharts illustrating exemplary implementations of determining whether a virtual repair request complies with a virtual repair rule.

FIG. 7 is a flowchart illustrating an exemplary implementation of determining whether a virtual repair request complies with a virtual repair rule (508) (FIG. 5). The virtual repair unit determines an amount of digital content being requested (700). The amount can be represented as a number of bits, bytes, words, and the like, that are included for each requested digital content segment. The virtual repair unit compares the amount of digital content being request to a threshold value (702). The threshold value can be a predetermined value based on, for example, a service agreement between a subscriber to the virtual repair service and virtual repair unit. Alternatively, or in addition, the virtual repair unit can dynamically adjust the threshold value based on previous virtual repair requests from the player or based on a percentage of digital content being requested with respect to the size of the entire digital media. In some embodiments, the threshold can be compared to each independent digital content segment included in the virtual repair request such that some of the digital content segments may qualify for virtual repair and some of the digital content segments may not qualify for virtual repair. In some embodiments, the aggregate amount of digital content is compared to the threshold. If the amount of digital content requested exceeds the threshold value (704), the virtual repair unit denies the request (706). Otherwise, the virtual repair unit performs the virtual repair (708).

Figure 8:
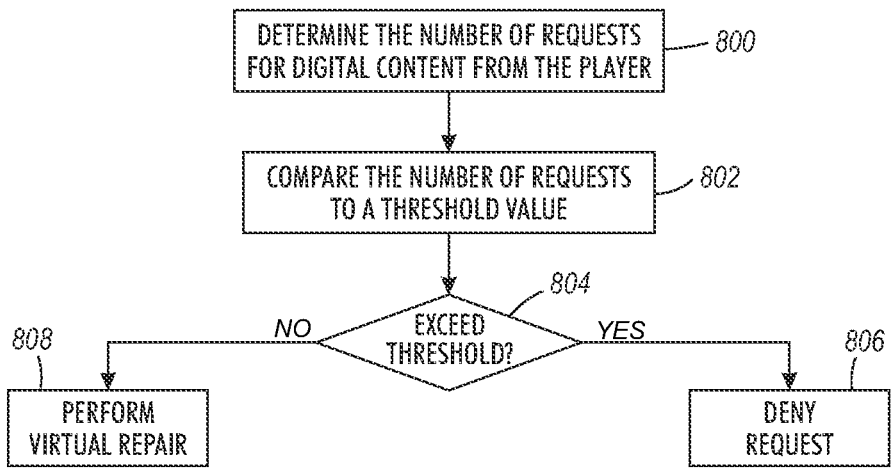

FIG. 8 is a flowchart illustrating another exemplary implementation of determining whether a virtual repair request complies with a virtual repair rule (508) (FIG. 5). The virtual repair unit determines a number of virtual repair requests received from the player (800). The number of virtual repair requests can be a total number of virtual repair requests received from the player and/or a number of requests received from the player within a specified time period. For example, the virtual repair unit can determine how many requests were received from the player in the last year, month, week, day, hour, and so on. The virtual repair unit compares the number of requests received from the player to a threshold value (802). The threshold value can be a predetermined value based on, for example, a service agreement between a subscriber to the virtual repair service and virtual repair unit. Alternatively, or in addition, the virtual repair unit can dynamically adjust the threshold value based on previous virtual repair requests from the player. If the number of requests exceeds the threshold value (804), the virtual repair unit denies the request (806). Otherwise, the virtual repair unit performs the virtual repair (808).

Figure 9:
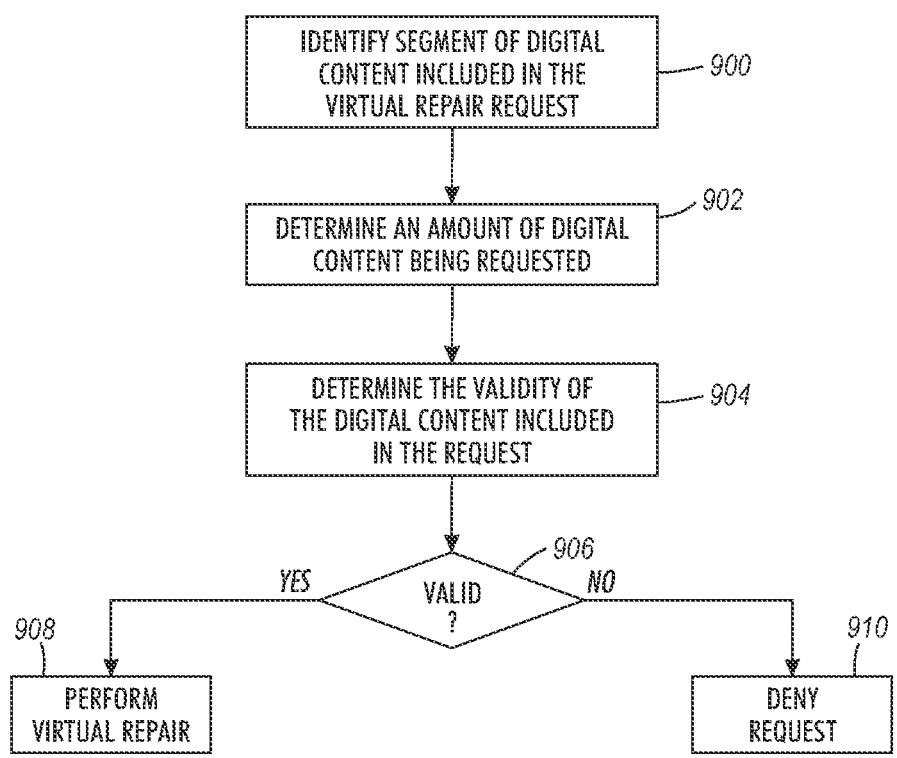

FIG. 9 is a flowchart illustrating an exemplary implementation for determining whether a virtual repair request complies with a virtual repair rule (508) (FIG. 5). The authorization unit of the virtual repair unit can identify a segment of digital content included in the virtual repair request, which was read from the digital media device by the player making the virtual repair request and was included in the virtual repair request as a quid pro quo (900). The amount of digital content required to be uploaded can be a predetermined amount, which can be a fixed amount or a variable amount. In some embodiments, the amount of digital content required to be uploaded to the virtual repair unit can be proportional to an amount of digital content being requested by the player. For example, the virtual repair service can require a one-to-one ratio so that the amount of readable digital content required is substantially equal to an amount of digital content being requested. For example, if the player is requesting a virtual repair of a 300 megabyte (MB) segment of unreadable digital content, the virtual repair request must include a digital content segment read by the player that is about 300 MB. Although a one-to-one ratio is used for illustrative purposes, those skilled in the art will recognize that other ratios can be used, such as a one-to-two ratio, which requires that the virtual repair request include an amount of readable digital content that is half that of the amount of the digital content being requested. The virtual repair unit determines an amount of digital content being requested (902). The amount or size of the digital content can be represented as a number of bits, bytes, words, and the like, that are included for each requested digital content segment. The authorization unit of the virtual repair unit determines whether the validity of the uploaded digital content (904). If the uploaded digital content is valid (906), the virtual repair service is performed (908). Otherwise, the virtual repair request is denied (910).

Figure 10:
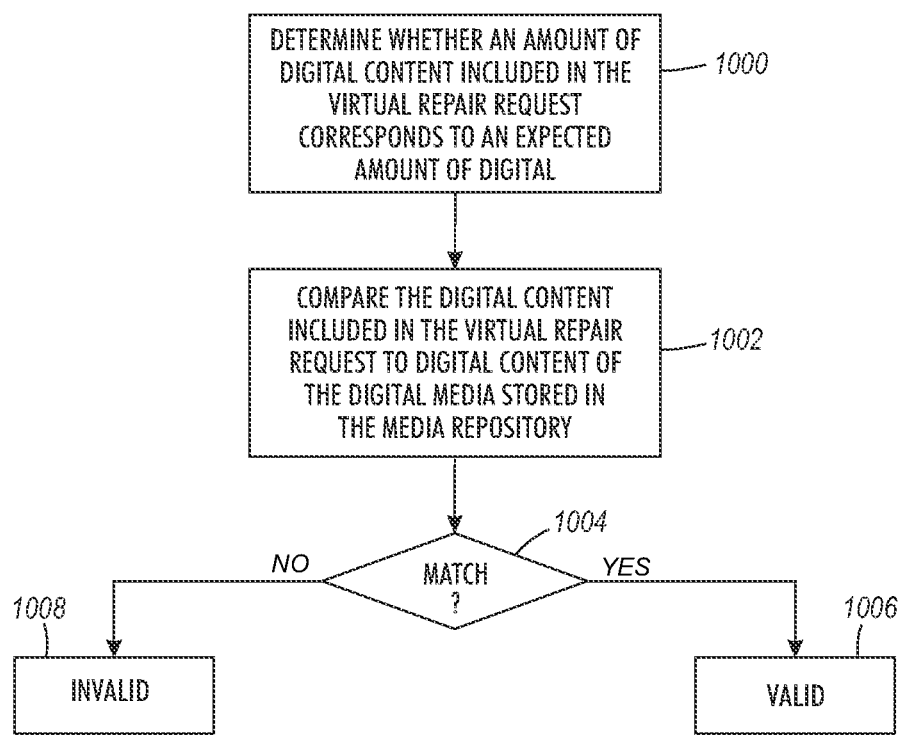

FIG. 10 is a flowchart illustrating an exemplary implementation for determining the validity of the digital content uploaded to the virtual repair unit in the virtual repair request (904) (FIG. 9). To determine validity, the authorization unit of the virtual repair unit can determine whether the amount of digital content included in the virtual repair request corresponds to an expected amount of digital content (1000). The expected amount of digital content can be proportional to the amount of digital content for which the virtual repair service is being requested or can be a predetermined fixed amount of digital content. The virtual repair unit compares the digital content included in the virtual repair request to a copy of the digital content stored in the media repository (1002). If the digital content included in the virtual repair request matches the copy of the digital content (1004), the virtual repair request is valid (1006). If there is no match (1004), the virtual repair request is invalid (1008).

By requiring a virtual repair request to include an amount of digital content that is proportional to the amount of digital content for which the virtual repair service is being requested, the virtual repair unit can prevent and/or discourage a group of people from acting in concert to obtain the digital content, where at least one of the people in the group is unauthorized an user of the virtual repair service and at least one of the people in the group is an authorized user acting as a "Bad Samaritan". The Bad Samaritan can have the original digital media, for example on a digital media disk, and can be prepared to provide the unauthorized users of the group with information for complying with the virtual repair rules, such as a player identifier, a media identifier, a segment identifier, and the like.

Such an attack (i.e. a coordinated attempt by a group of users to obtain digital content from the virtual repair service without authorization) may be worthwhile because the attackers are stealing bandwidth. In this manner, rather than transferring all the bytes from the Bad Samaritan to the unauthorized users (a lot of bytes if all of the unauthorized users want a copy of the media), the unauthorized users use the bandwidth of the virtual repair service to obtain a copy of the digital media instead. Using an exchange of data for each virtual repair, requires each user who wishes to use the virtual repair service for receiving digital content from the virtual repair service to upload a proportional amount of digital content, such as a substantial equal amount, as a quid pro quo. As a result, those who want to steal bandwidth and eschew the virtual repair rules can be substantially defeated because they can be forced to consume the full amount of bandwidth by uploading an amount of digital content to the virtual repair service before they can obtain substantially equal amount of digital content in return.

Figure 11:
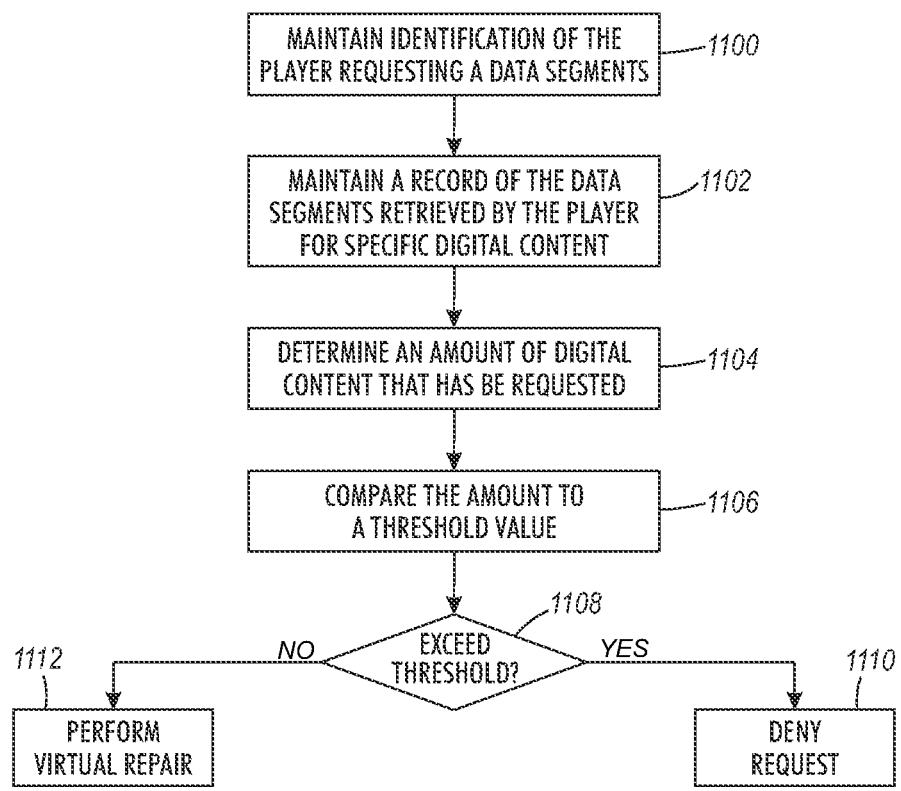

FIG. 11 is a flowchart illustrating another exemplary implementation of determining whether a virtual repair request complies with a virtual repair rule (508) (FIG. 5). The virtual repair unit can maintain an identification of a player requesting a copy of readable digital content segments (1100) and can maintain a record of the digital content segments requested by the player for specific digital media (1102). Using this information, the virtual repair unit determines an amount of digital content that has been requested by the player with respect to the specific digital media (1104). The amount of digital content that has been requested by the player with respect to the specific digital media, as determined by the virtual repair unit, is compared to a threshold value (1106). The threshold value can be a percentage of the digital content requested with respect to the entire digital media. If the amount of digital content that has been requested by the player with respect to the specific digital media exceeds the threshold value (1108), the virtual repair unit denies the request (1110). Otherwise, the virtual repair unit performs the virtual repair (1112).

Figure 12:
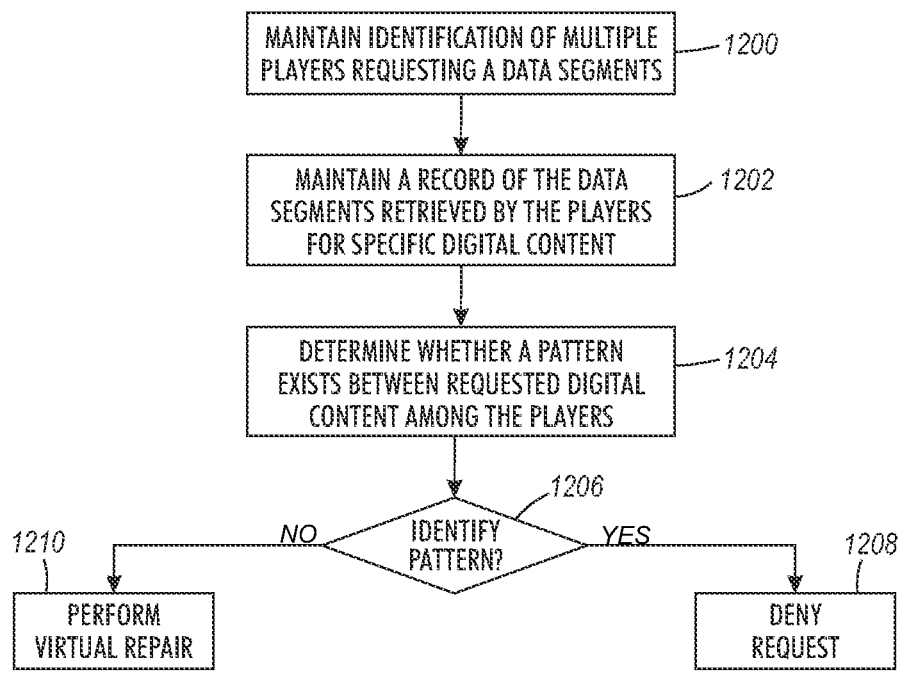

FIG. 12 is a flowchart illustrating another exemplary implementation of determining whether a virtual repair request complies with a virtual repair rule (508) (FIG. 5). The virtual repair unit can maintain an identification of multiple players requesting a copy of readable digital content segments for particular digital media (1200) and can maintain a record of the digital content segments requested by the players for the specific digital media (1202). Using this information, the virtual repair unit can determine whether a pattern exists between the requested digital content segments and the players (1204). For example, the virtual repair unit identifies whether virtual repair requests from multiple players occurring within a specified time period for particular digital media represent a coordinated attempt by a group of users to reconstruct the entire digital media and eschew the virtual repair rules. If a pattern is detected (1206), the virtual repair unit denies the request (1208). Otherwise, the virtual repair unit performs the virtual repair (1210).

In some embodiments, correlations or patterns in requests from a particular source are calculated to determine whether or not a systematic attempt is being made to retrieve the entire data source, possibly using multiple media players feigning media errors. The virtual repair unit can make arbitrarily sophisticated or nuanced decision about how much error recovery to provide using the virtual repair service, which may be based on knowledge of the consumer of rental institution which owns the media, contractual arrangements, and so on.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

The invention claimed is:

1. A method for virtual repair of digital media using a virtual repair service comprising:
    receiving, from a media player reading the digital media stored on a digital media device, a request to perform a virtual repair of a segment of unreadable digital content of the digital media using a virtual repair unit;
    retrieving, from a media repository using the virtual repair unit, a readable copy of the digital content corresponding to the segment of unreadable digital content identified in the request;
    determining, by the virtual repair unit and in response to the request, whether to perform the virtual repair based on a virtual repair rule assessing the validity of the request, determining whether to perform the virtual repair including
        determining an amount of digital content being requested in the virtual repair request;
        comparing the amount of digital content being requested in the virtual repair request to a threshold value;
        denying the request for virtual repair when the amount of digital content being requested exceeds the threshold value; and
    transmitting the readable copy of the digital content to the media player for insertion into a buffer of the media player responsive to a determination to perform the repair request.

2. The method of claim 1, wherein receiving the request includes receiving a player identifier, the player identifier being used by the virtual repair unit to determine whether the media player is authorized to use the virtual repair service.

3. The method of claim 1, wherein receiving the request includes receiving a media identifier and a segment identifier, the media identifier and the segment identifier being used by the virtual repair unit to identify the digital media and the segment of the digital content from the digital media being requested by the media player.

4. The method of claim 1, further comprising:
    determining a number of virtual repair requests received from the media player;
    comparing the number of virtual repair requests received from the player to a threshold value; and
    denying the request when the number of virtual requests exceeds the threshold value.

5. A method for virtual repair of digital media using a virtual repair service comprising:
    receiving, from a media player reading the digital media stored on a digital media device, a request to perform a virtual repair of a segment of unreadable digital content of the digital media using a virtual repair unit;
    retrieving, from a media repository using the virtual repair unit, a readable copy of the digital content corresponding to the segment of unreadable digital content identified in the request;
    determining, by the virtual repair unit and in response to the request, whether to perform the virtual repair based on a virtual repair rule assessing the validity of the request, determining whether to perform the virtual repair including
        determining an amount of digital content that has been requested by the media player with respect to the digital media;
        comparing the amount of digital content that has been requested by the media player with respect to the specific digital media to a threshold value; and
        denying the request when the amount of digital content that has been requested by the player with respect to the specific digital media exceeds the threshold value; and
    transmitting the readable copy of the digital content to the media player for insertion into a buffer of the media player responsive to a determination to perform the repair request.

6. A method for virtual repair of digital media using a virtual repair service comprising:
    receiving, from a media player reading the digital media stored on a digital media device, a request to perform a virtual repair of a segment of unreadable digital content of the digital media using a virtual repair unit;
    retrieving, from a media repository using the virtual repair unit, a readable copy of the digital content corresponding to the segment of unreadable digital content identified in the request;
    determining, by the virtual repair unit and in response to the request, whether to perform the virtual repair based on a virtual repair rule assessing the validity of the request, determining whether to perform the virtual repair including
        maintaining an identification a plurality of media players requesting a copy of readable digital content segments for the digital media and a record of the digital content segments requested by the players for the digital media;
        determining whether the plurality of media players are attempting to eschew the virtual repair rule; and
        denying the request in response to the determining; and
    transmitting the readable copy of the digital content to the media player for insertion into a buffer of the media player responsive to a determination to perform the repair request.

7. The method of claim 1, wherein the request includes an amount of readable digital content that is proportional to an amount of unreadable digital content being requested and the method further comprises:
    determining a validity of the readable digital content included in the request; and performing the virtual repair service in response to a determination of the validity.

8. The method of claim 7, wherein the request includes an amount of readable digital content that is substantially equal to an amount of unreadable digital content being requested.

9. A system for virtual repair of digital media comprising:
a media repository storing a readable copy of the digital media; and
a virtual repair unit configured to interface with the media repository, the virtual repair unit receiving, from a media player reading the digital media stored on a digital media device, a request to perform a virtual repair of a segment of unreadable digital content of the digital media using a virtual repair unit; retrieving, from the media repository, a readable copy of the digital content corresponding to the segment of unreadable digital content identified in the request; and transmitting the readable copy of the digital content to the media player for insertion into a buffer of the media player,
wherein the virtual repair unit includes an authorization unit configured to determine whether the media player is authorized to use the virtual repair service and to ascertain the validity of the request by determining whether the request complies with a virtual repair rule, and determining the request complies with a virtual repair rule includes
determining an amount of digital content being requested in the virtual repair request,
comparing the amount of digital content being requested in the virtual repair request to a threshold value, and
denying the request for virtual repair when the amount of digital content being requested exceeds the threshold value.

10. The system of claim 9, wherein the authorization unit determines whether the media player is authorized to use the virtual repair service based on a player identifier included in the request.

11. The system of claim 9, wherein the authorization unit determines whether the request complies with the virtual repair rule based on a media identifier and a segment identifier included in the request, the media identifier and the segment identifier being used by the virtual repair unit to identify the digital media and the segment of the digital content from the digital media being requested by the media player.

12. The system of claim 9, wherein the request includes an amount of readable digital content that is substantially equal to an amount of unreadable digital content being requested, the virtual repair unit being configured to determine a validity of the readable digital content and to perform the virtual repair service in response to a determination of the validity.

13. A non-transitory machine-readable storage medium storing instructions executable by a computing system including at least one computing device, wherein execution of the instructions implements a method for virtual repair of digital media comprising:
receiving, from a media player reading the digital media store on a digital media device, a request to perform a virtual repair of a segment of unreadable digital content of the digital media using a virtual repair unit;
retrieving, from a media repository using the virtual repair unit, a readable copy of the digital content corresponding to the segment of unreadable digital content identified in the request;
transmitting the readable copy of the digital content to the media player for insertion into a buffer of the media player; and
determining, by the virtual repair unit and in response to the request, whether to perform the virtual repair based on a virtual repair rule assessing the validity of the request, and assessing the validity of the request includes
determining an amount of digital content being requested in the virtual repair request,
comparing the amount of digital content being requested in the virtual repair request to a threshold value, and
denying the request for virtual repair when the amount of digital content being requested exceeds the threshold value.

14. The non-transitory machine-readable storage medium of claim 13, wherein receiving the request includes receiving a player identifier, the player identifier being used by the virtual repair unit to determine whether the media player is authorized to use the virtual repair service.

15. The non-transitory machine-readable storage medium of claim 13, wherein receiving the request includes receiving a media identifier and a segment identifier, the media identifier and the segment identifier being used by the virtual repair unit to identify the digital media and the segment of the digital content from the digital media being requested by the media player.

16. The non-transitory machine-readable storage medium of claim 13, wherein the request includes an amount of readable digital content that is substantially equal to an amount of unreadable digital content being requested, the instructions for implementing the method further comprising:
determining a validity of the readable digital content included in the request; and
performing the virtual repair service in response to a determination of the validity.

* * * * *